US011715664B2

United States Patent
Saito et al.

(10) Patent No.: US 11,715,664 B2
(45) Date of Patent: Aug. 1, 2023

(54) HOLDING MECHANISM (71) Applicant: DISCO CORPORATION, Tokyo (JP)

(72) Inventors: Yoshinobu Saito, Tokyo (JP);
Yoshinori Kakinuma, Tokyo (JP);
Takashi Mori, Tokyo (JP)

(73) Assignee: DISCO CORPORATION, Tokyo (JP)

(*) Notice: Subject to any disclaimer, the term of this patent is extended or adjusted under 35 U.S.C. 154(b) by 52 days.

(21) Appl. No.: 17/448,070

(22) Filed: Sep. 20, 2021

(65) Prior Publication Data

US 2022/0108910 A1 Apr. 7, 2022

(30) Foreign Application Priority Data

Oct. 1, 2020 (JP) .................. 2020-167052

(51) Int. Cl.
H01L 21/683 (2006.01)
H01L 21/677 (2006.01)
H01L 21/67 (2006.01)

(52) U.S. Cl.
CPC .... H01L 21/6838 (2013.01); *H01L 21/67092* (2013.01); *H01L 21/67778* (2013.01)

(58) Field of Classification Search
CPC ............... H01L 21/683; H01L 21/6838; H01L 21/67778; H01L 21/68728; H01L 21/68735; H01L 21/68785; H01L 21/67092; B25B 11/00; E05B 51/02; E05B 51/023; E05B 51/026

USPC ............................................................ 269/8
See application file for complete search history.

(56) References Cited

FOREIGN PATENT DOCUMENTS

| CN | 201045735 Y | * | 4/2008 |
|----|----|----|----|
| JP | 2008205277 A | * | 9/2008 |
| JP | 2008205277 A | | 9/2008 |
| JP | 2009141122 A | * | 6/2009 |
| JP | 2009141122 A | | 6/2009 |
| JP | 2015115418 A | * | 6/2015 |
| JP | 2015115418 A | | 6/2015 |
| JP | 2015135888 A | | 7/2015 |

OTHER PUBLICATIONS

JP-2008205277-A translation (Year: 2008).*
CN-201045735-Y translation (Year: 2008).*
JP-2009141122-A translation (Year: 2009).*
JP-2015115418-A translation (Year: 2015).*
Search report issued in counterpart Singapore patent application 10202110109S dated Nov. 8, 2022.

* cited by examiner

Primary Examiner — Tyrone V Hall, Jr.
Assistant Examiner — Abbie E Quann
(74) Attorney, Agent, or Firm — Greer Burns & Crain Ltd.

(57) ABSTRACT

A holding mechanism includes a wafer holding section that holds a wafer under suction, and a frame support section that is disposed on the outer circumference of the wafer holding section and that supports a frame. The frame support section includes a permanent magnet.

11 Claims, 5 Drawing Sheets

HOLDING MECHANISM

BACKGROUND OF THE INVENTION

Field of the Invention

The present invention relates to a holding mechanism for holding a frame unit formed by positioning a wafer at an opening of an annular frame that includes a ferromagnetic material and that is provided at the center thereof with the opening for accommodating the wafer, and by attaching the wafer and the annular frame to an adhesive tape to integrate the annular frame with the wafer.

Description of the Related Art

A wafer formed on a front surface thereof with a device area where a plurality of devices such as integrated circuits (ICs) and large-scale integrated (LSI) circuits are partitioned by a plurality of intersecting division lines and a peripheral marginal area surrounding the device area is ground on the back side to be formed to a desired thickness and is then divided into individual device chips by a dicing apparatus or a laser processing apparatus. The divided device chips are used for electric equipment such as mobile phones and personal computers.

In addition, before the wafer is conveyed into the dicing apparatus or the laser processing apparatus, the wafer is positioned at an opening of an annular frame that includes a ferromagnetic material and that is provided at the center thereof with the opening for accommodating the wafer, and is attached integrally with the annular frame to an adhesive tape to form a frame unit.

Then, the frame unit is conveyed by a conveying mechanism and is held by a holding mechanism of the dicing apparatus or the laser processing apparatus, and the wafer is subjected to processing (see, for example, Japanese Patent Laid-open No. 2015-135888).

SUMMARY OF THE INVENTION

The conveying mechanism includes a frame holding section that holds the annular frame under suction, a wafer holding section that is disposed as required and holds the wafer under suction, and a conveying arm. In addition, the holding mechanism includes a wafer holding section that holds the wafer under suction through an adhesive tape, and a frame support section that clamps the annular frame. However, since, in the holding mechanism, the clamp for clamping the annular frame has a structure in which a plate in an erected state is rotated to be laid horizontally to thereby clamp the annular frame from above, there is a problem that the annular frame cannot be held by the holding mechanism if the annular frame is not positioned sufficiently accurately by the conveying mechanism.

Accordingly, it is an object of the present invention to provide a holding mechanism capable of securely holding an annular frame even when the annular frame is not positioned sufficiently accurately.

In accordance with an aspect of the present invention, there is provided a holding mechanism that holds a frame unit formed by positioning a wafer at an opening of an annular frame and attaching the wafer and the annular frame to an adhesive tape to integrate the annular frame with the wafer, the annular frame including a ferromagnetic material and being provided at a center thereof with the opening for accommodating the wafer. The holding mechanism includes a wafer holding section that holds the wafer under suction, and a frame support section that is disposed on the outer circumference of the wafer holding section and that supports the annular frame. The frame support section includes a permanent magnet.

Preferably, the frame support section includes a release section that releases the annular frame magnetically attached to the permanent magnet. Preferably, the release section includes at least a tubular body that includes a nonmagnetic material and that accommodates the permanent magnet, and an advancing-retracting section that relatively advances and retracts the permanent magnet and the tubular body, and the permanent magnet is relatively retracted from the tubular body to thereby release the annular frame from the permanent magnet.

According to the present invention, the holding mechanism includes the wafer holding section that holds the wafer under suction, and the frame support section that is disposed on the outer circumference of the wafer holding section and that supports the annular frame, and the frame support section includes a permanent magnet. Therefore, the annular frame can be held even if the annular frame is not positioned sufficiently accurately.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
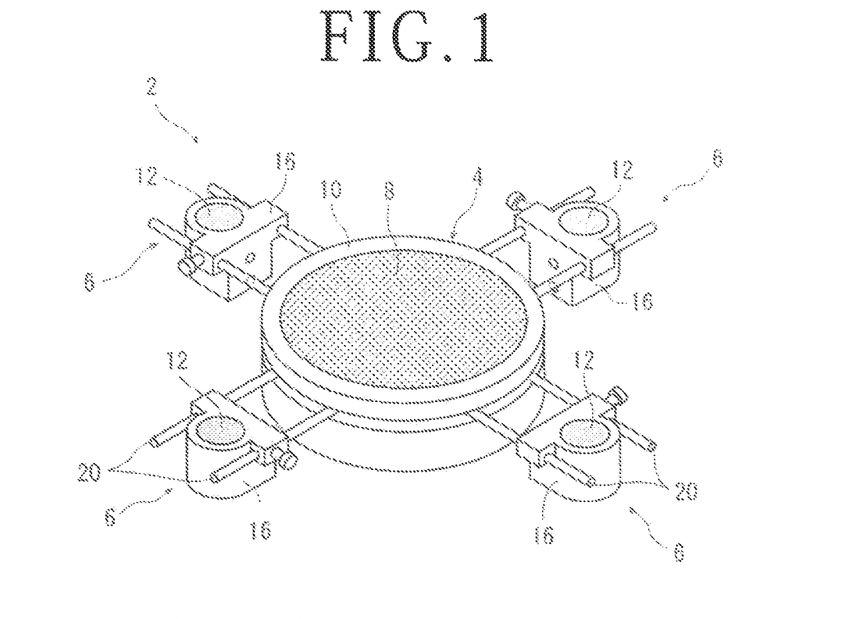
FIG. 1 is a perspective view of a holding mechanism according to an embodiment of the present invention.

A holding mechanism according to an embodiment of the present invention will be described below referring to the drawings. Referring to FIG. 1, the holding mechanism, which is wholly denoted by reference symbol 2, includes a wafer holding section 4 that holds a wafer under suction, and frame support sections 6 that are disposed on the outer circumference of the wafer holding section 4 and support an annular frame.

The wafer holding section 4 includes a disk-shaped suction chuck 8 and a casing 10 fitted to the outer circumference of the suction chuck 8. The suction chuck 8 is formed of a porous material and is connected to suction means (not illustrated) through a channel. As depicted in FIG. 1, an upper surface of the suction chuck 8 is exposed, while a peripheral portion and a lower surface of the suction chuck 8 are covered with the casing 10. In the wafer holding section 4, by operating the suction means to generate a suction force at the upper surface of the suction chuck 8, the wafer placed on the upper surface of the suction chuck 8 is held under suction.

Figure 2A:
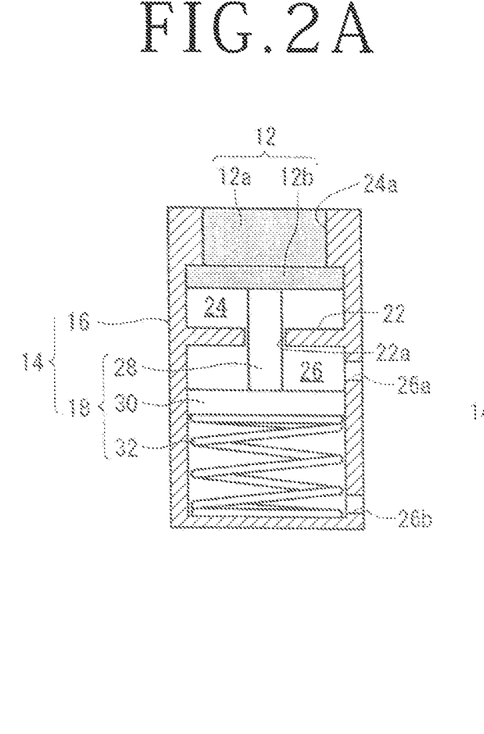
FIG. 2A is a sectional view of a release section depicted in FIG. 1.
Figure 2B:
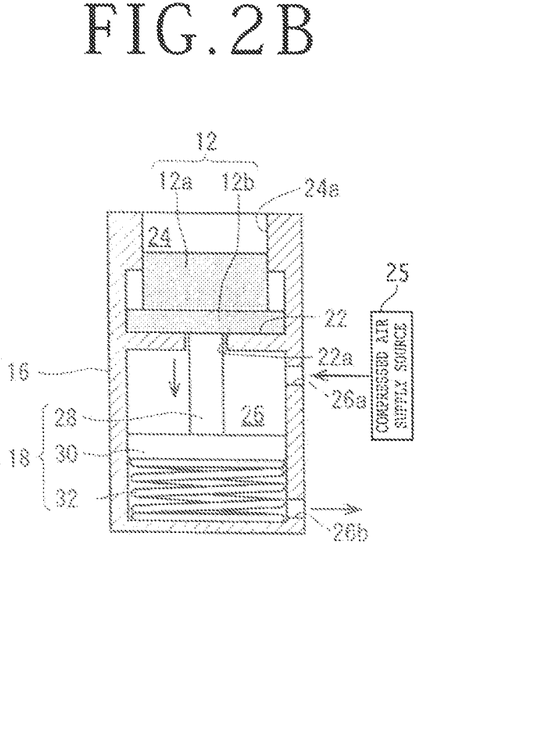
FIG. 2B is a sectional view of the release section in a state in which a permanent magnet is retracted.

It is important that the frame support section 6 includes a permanent magnet 12 that magnetically attracts the annular frame. In addition, as depicted in FIG. 2, the frame support section 6 preferably includes a release section 14 that releases the annular frame magnetically attached to the permanent magnet 12. The release section 14 in the present embodiment includes a tubular body 16 that includes a nonmagnetic material and that accommodates the permanent magnet 12, and an advancing-retracting section 18 that relatively advances and retracts the permanent magnet 12 and the tubular body 16. The permanent magnet 12 is relatively advanced or retracted from the tubular body 16 to release the annular frame from the permanent magnet 12.

As illustrated in FIG. 1, a plurality of (in the present embodiment, four) frame support sections 6 are disposed at intervals along the circumferential direction of the wafer holding section 4. In the present embodiment, each of the tubular bodies 16 of the frame support sections 6 is connected to the casing 10 through a pair of support rods 20 extending toward the radial-directionally outer side from the outer circumference of the casing 10 of the wafer holding section 4. In an upper portion of each tubular body 16, the permanent magnet 12 that magnetically attracts the annular frame is accommodated. Note that each tubular body 16 is supported by the support rods 20 in a radially movable manner, and a plurality of kinds of annular frames different in size can be supported by adjusting the radial position of each tubular body 16.

Referring to FIGS. 2A and 2B, the permanent magnet 12 in the present embodiment has a cylindrical main section 12a that magnetically attracts the annular frame at an upper end surface thereof, and an annular flange section 12b extending toward the radial-directionally outer side from a lower end of the main section 12a. In addition, the permanent magnet 12 is accommodated inside the tubular body 16 in such a manner as to be movable in the vertical direction between a raised position depicted in FIG. 2A and a lowered position depicted in FIG. 2B. As understood by referring to FIGS. 2A and 2B, at the raised position, an upper surface of the permanent magnet 12 and an upper surface of the tubular body 16 are flush with each other, while, at the lowered position, the upper surface of the permanent magnet 12 is located on the lower side relative to the upper surface of the tubular body 16 by approximately 5 mm, for example.

As depicted in FIGS. 2A and 2B, a partition wall 22 is provided at a vertically intermediate part of the tubular body 16, and by the partition wall 22, the inside of the tubular body 16 is partitioned into an upper-side accommodating chamber 24 for accommodating the permanent magnet 12 and a lower-side accommodating chamber 26 for accommodating the advancing-retracting section 18. The partition wall 22 is formed in its central portion with a through-hole 22a.

On an upper end side of the upper-side accommodating chamber 24, a projecting section 24a projecting toward the radial-directionally inner side of the tubular body 16 is formed. As depicted in FIG. 2A, when an upward force is exerted on the permanent magnet 12 from the advancing-retracting section 18, an upper end of the flange section 12b of the permanent magnet 12 is caught on a lower end of the projecting section 24a, so that the permanent magnet 12 is positioned at the raised position. On the other hand, when a downward force is exerted on the permanent magnet 12 from the advancing-retracting section 18, as depicted in FIG. 2B, a lower surface of the permanent magnet 12 makes contact with an upper surface of the partition wall 22, so that the permanent magnet 12 is positioned at the lowered position. In addition, the lower-side accommodating chamber 26 is formed with an upper opening 26a and a lower opening 26b at an interval in the vertical direction.

Referring to FIGS. 2A and 2B, the advancing-retracting section 18 in the present embodiment has a rod 28 extending downward from a lower end of the permanent magnet 12 through the through-hole 22a, a piston 30 fixed to a lower end of the rod 28 and disposed in the lower-side accommodating chamber 26, a coil spring 32 disposed under the piston 30, and a compressed air supply source 25 connected to the upper opening 26a of the lower-side accommodating chamber 26.

In the advancing-retracting section 18, when the supply of compressed air from the compressed air supply source to the lower-side accommodating chamber 26 is stopped to push the piston 30 upward by the coil spring 32, an upward force is exerted on the permanent magnet 12, the permanent magnet 12 is raised relative to the tubular body 16, and the permanent magnet 12 is thus positioned at the raised position. Further, in the advancing-retracting section 18, when compressed air is supplied from the compressed air supply source 25 into the lower-side accommodating chamber 26 to push the piston 30 downward, a downward force is exerted on the permanent magnet 12, the permanent magnet 12 is lowered relative to the tubular body 16, and the permanent magnet 12 is thus positioned at the lowered position. Note that, by pushing the piston 30 downward, air is discharged through the lower opening 26b.

Further, the release section 14 of the holding mechanism 2 is configured to position the permanent magnet 12 at the raised position where the permanent magnet 12 can magnetically attract the annular frame disposed on the tubular body 16, and also position the permanent magnet 12 at the lowered position where the annular frame disposed on the tubular body 16 can be released from the permanent magnet 12.

Figure 3:
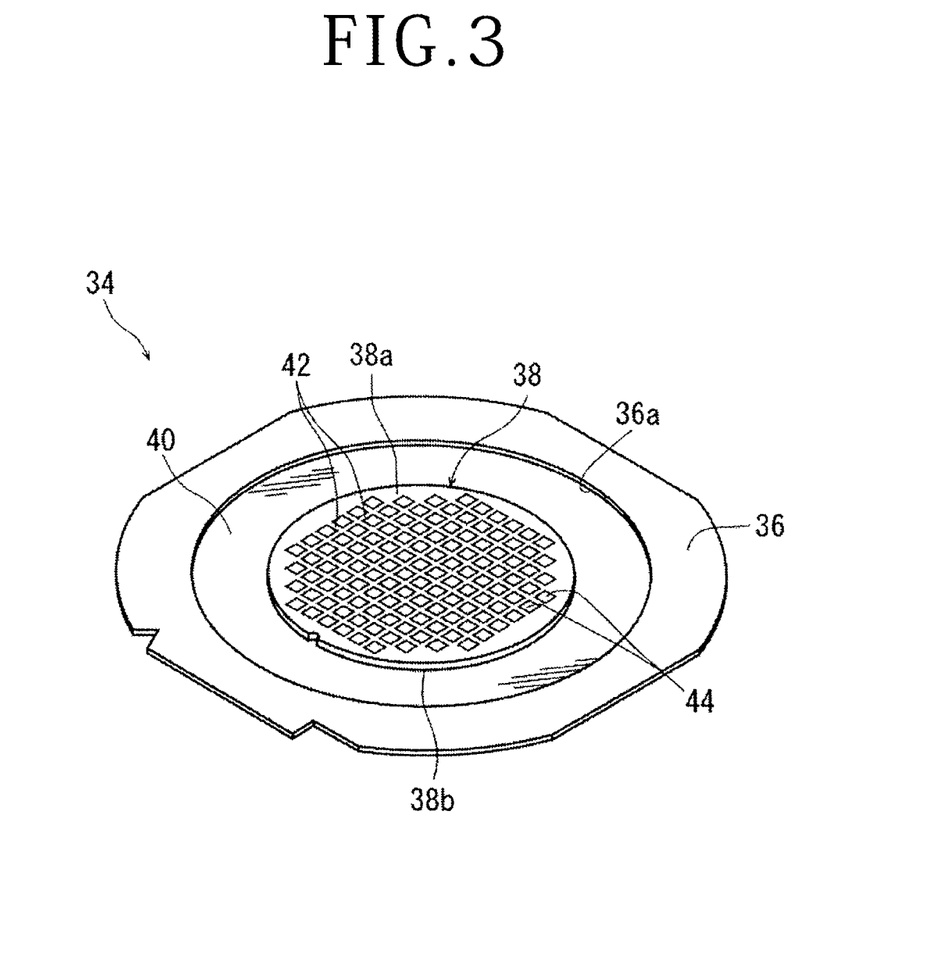
FIG. 3 is a perspective view of a frame unit.

FIG. 3 illustrates a frame unit 34 held by the abovementioned holding mechanism 2. The frame unit 34 is a unit obtained by integrating an annular frame 36 with a disk-shaped wafer 38 through a circular adhesive tape 40. The annular frame 36 includes a ferromagnetic material and is provided at its center with a circular opening 36a for accommodating the wafer 38. The wafer 38 may be formed of silicon or the like. A front surface 38a of the wafer 38 is partitioned into a plurality of rectangular regions by division lines 42 formed in a grid pattern, and a device 44 such as an IC or an LSI circuit is formed in each of the plurality of rectangular regions. In the present embodiment, as depicted in FIG. 3, a back surface 38b of the wafer 38 is attached to the adhesive tape 40 positioned at the opening 36a of the annular frame 36, so that the annular frame 36 is integrated with the wafer 38.

Figure 4:
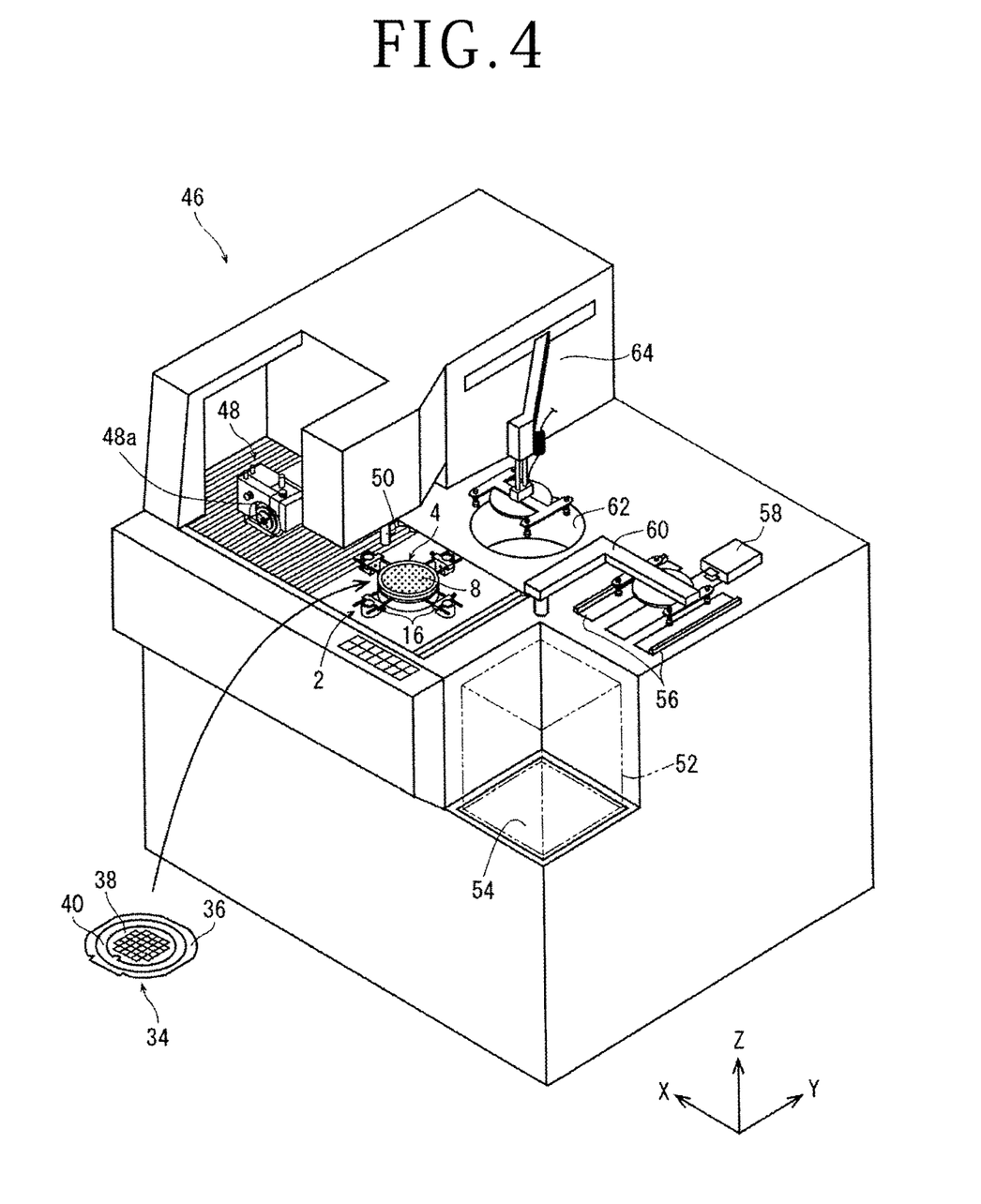
FIG. 4 is a perspective view of a dicing apparatus including the holding mechanism depicted in FIG. 1.

FIG. 4 depicts a dicing apparatus 46 to which the above-mentioned holding mechanism 2 can be mounted. In the dicing apparatus 46 in the present embodiment, the holding mechanism 2 is provided in such a manner as to be movable in an X-axis direction indicated by an arrow X. Note that a Y-axis direction indicated by an arrow Y in FIG. 4 is a direction orthogonal to the X-axis direction, and a Z-axis direction indicated by an arrow Z in FIG. 4 is a vertical direction which is orthogonal to both the X-axis direction and the Y-axis direction. In addition, an XY plane defined by the X-axis direction and the Y-axis direction is substantially horizontal.

The dicing apparatus 46 includes a cutting unit 48 that rotatably includes a cutting blade 48a for cutting the wafer 38 held by the holding mechanism 2, an imaging unit 50 that images the wafer 38 held by the holding mechanism 2, a cassette mount base 54 on which a cassette 52 accommodating a plurality of frame units 34 is mounted and which is liftable upward and downward, a conveying-in/out mechanism 58 that draws out the frame unit 34 which is yet to be cut from the cassette 52, conveys the frame unit 34 to a tentative placing table 56, and conveys the cut frame unit 34 positioned on the tentative placing table 56 into the cassette 52, a first conveying mechanism 60 that conveys, to the holding mechanism 2, the frame unit 34 which has been conveyed out from the cassette 52 onto the tentative placing table 56 and which is yet to be cut, a cleaning unit 62 that cleans the cut frame unit 34, and a second conveying mechanism 64 that conveys the cut frame unit 34 from the holding mechanism 2 to the cleaning unit 62.

Figure 5:
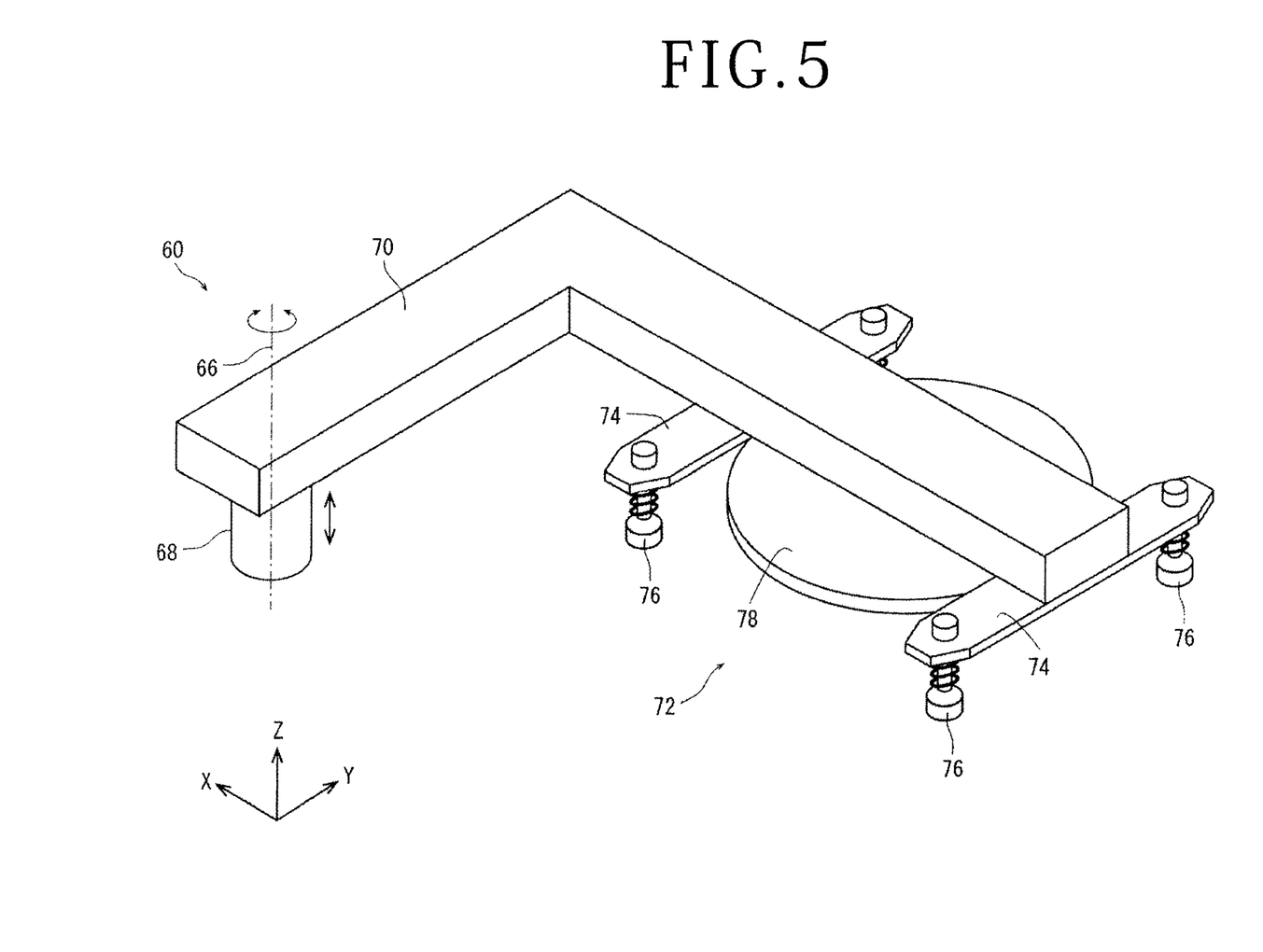
FIG. 5 is a perspective view of a first conveying mechanism depicted in FIG. 4.

Referring to FIG. 5, the first conveying mechanism 60 will be described. The first conveying mechanism 60 includes a support shaft 68 that is rotatable around an axis 66 extending in the Z-axis direction and that is liftable upward and downward in the Z-axis direction, an L-shaped arm 70 fixed to an upper end of the support shaft 68, and a frame unit holding section 72 attached to an end portion of the arm 70.

The frame unit holding section 72 has a pair of plates 74 fixed to a lower surface of the end portion of the arm 70 at an interval, a plurality of permanent magnets 76 that are mounted to lower surfaces of the pair of plates 74 and magnetically attract the annular frame 36, and a disk-shaped suction piece 78 that is disposed between the pair of plates 74 and holds the wafer 38 under suction. The magnetic force of the permanent magnets 76 of the first conveying mechanism 60 is weaker than the magnetic force of the permanent magnets 12 of the holding mechanism 2. In addition, a lower surface of the suction piece 78 is formed with a plurality of suction holes (not illustrated), and each suction hole is connected to suction means.

Figure 6:
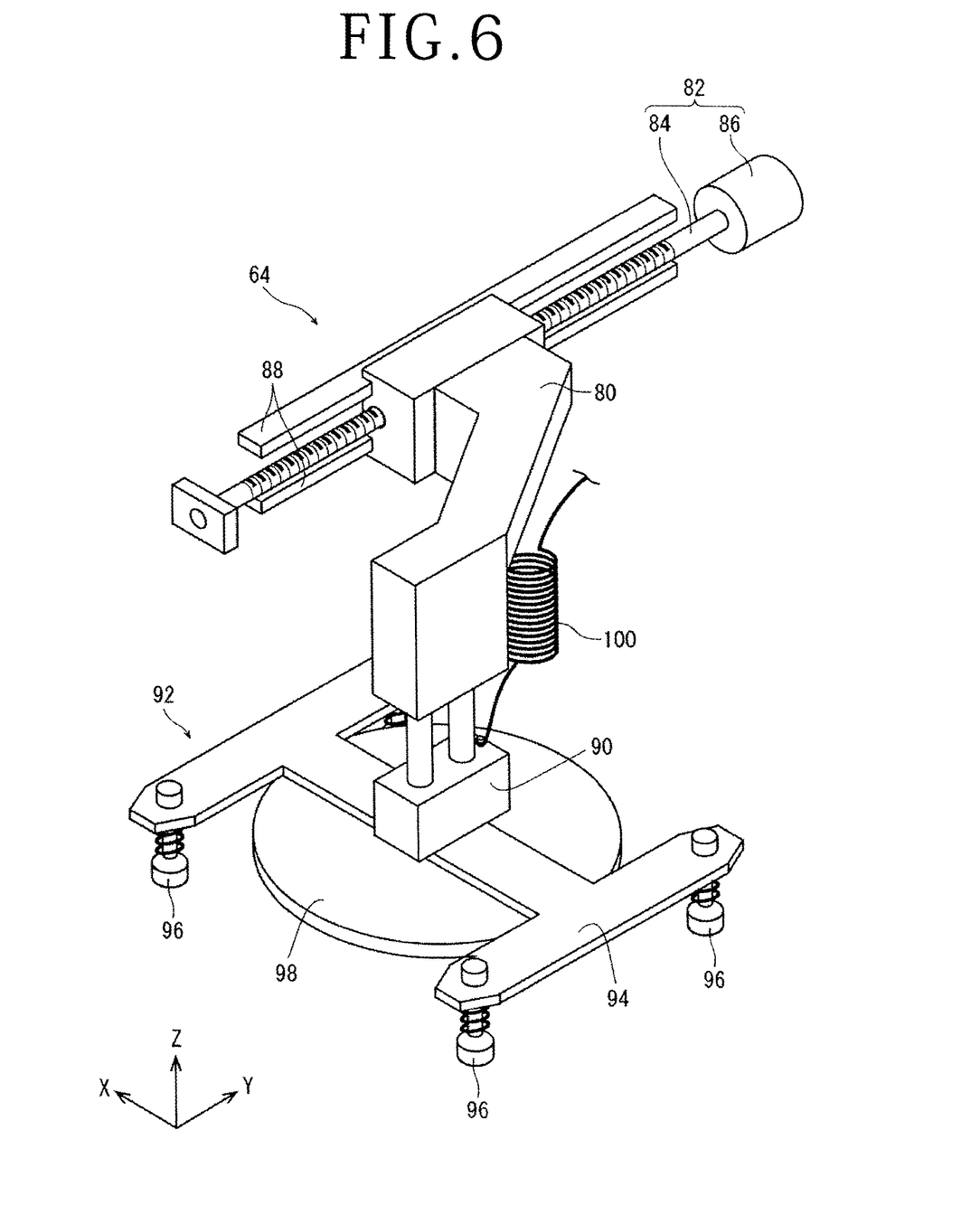
FIG. 6 is a perspective view of a second conveying mechanism depicted in FIG. 4.

Referring to FIG. 6, the second conveying mechanism 64 will be described. The second conveying mechanism 64 includes a Y-axis movable member 80 provided to be movable in the Y-axis direction and a Y-axis feeding mechanism 82 that moves the Y-axis movable member 80 in the Y-axis direction. The Y-axis feeding mechanism 82 has a ball screw 84 that is connected to the Y-axis movable member 80 and that extends in the Y-axis direction, and a motor 86 that rotates the ball screw 84. The Y-axis feeding mechanism 82 converts a rotational motion of the motor 86 into a rectilinear motion and transmits the rectilinear motion to the Y-axis movable member 80 by the ball screw 84, thereby to move the Y-axis movable member 80 in the Y-axis direction along a pair of guide rails 88 extending in the Y-axis direction.

To a lower surface of an end portion of the Y-axis movable member 80, a frame unit holding section 92 is connected such as to be liftable upward and downward through a lifting mechanism 90 which may include an appropriate actuator such as an air cylinder. The frame unit holding section 92 has an H-shaped plate 94 fixed to a lower end of the lifting mechanism 90, a plurality of permanent magnets 96 that are mounted to a lower surface of the plate 94 and magnetically attract the annular frame 36, and a disk-shaped suction piece 98 that is disposed on a lower surface of a central portion of the plate 94 and holds the wafer 38 under suction. The magnetic force of the permanent magnets 96 of the second conveying mechanism 64 is weaker than the magnetic force of the permanent magnets 12 of the holding mechanism 2. In addition, a lower surface of the suction piece 98 is formed with a plurality of suction holes (not illustrated), and each suction hole is connected to suction means through a channel 100.

In dividing the wafer 38 of the frame unit 34 into device chips each including the device 44 by use of the dicing apparatus 46, a conveying-out step is first carried out in which the frame unit 34 that is yet to be cut is conveyed out from the cassette 52 onto the tentative placing table 56 by the conveying-in/out mechanism 58.

After the conveying-out step is performed, a first conveying step is carried out in which the frame unit 34 is conveyed from the tentative placing table 56 to the holding mechanism 2 by the first conveying mechanism 60. In the first conveying step, the permanent magnets 76 of the first conveying mechanism 60 are first positioned above the annular frame 36, and the suction piece 78 is positioned above the wafer 38. Next, the arm 70 is lowered. Accordingly, lower surfaces of the permanent magnets 76 are brought into contact with an upper surface of the annular frame 36 to hold the annular frame 36 by the magnetic force of the permanent magnets 76, and a lower surface of the suction piece 78 is brought into contact with the front surface 38a of the wafer 38 to hold the wafer 38 by the suction force of the suction piece 78.

Next, the arm 70 is raised to space the frame unit 34 apart from the tentative placing table 56. Then, the arm 70 is rotated to position the frame unit 34 above the holding mechanism 2 positioned at a mounting and detaching position (the position depicted in FIG. 4). Subsequently, the arm 70 is lowered. Accordingly, the lower surface of the annular frame 36 is brought into contact with upper surfaces of the permanent magnets 12 of the holding mechanism 2 to hold the annular frame 36 by the magnetic force of the permanent magnets 12, and the back surface 38b side (the adhesive tape 40 side) of the wafer 38 is brought into contact with the upper surface of the suction chuck 8 of the holding mechanism 2 to hold the wafer 38 by the suction force of the suction chuck 8. In this instance, the permanent magnets 12 of the holding mechanism 2 are preliminarily positioned at the raised positions.

Next, the suction force of the suction piece 78 of the first conveying mechanism 60 is released, and thereafter, the arm 70 of the first conveying mechanism 60 is raised. Since the magnetic force of the permanent magnets 76 of the first conveying mechanism 60 is weaker than the magnetic force of the permanent magnets 12 of the holding mechanism 2 as described above, the annular frame 36 is transferred from the permanent magnets 76 to the permanent magnets 12. Then, when the arm 70 is raised, the frame unit 34 is held by the holding mechanism 2 and is spaced apart from the first conveying mechanism 60. In this way, the frame unit 34 is conveyed from the tentative placing table 56 to the holding mechanism 2.

After the first conveying step is performed, a dividing step is carried out in which the holding mechanism 2 is moved to the cutting position below the cutting unit 48 and cutting is then conducted by the cutting blade 48a along the division lines 42 of the wafer 38 held by the holding mechanism 2, to divide the wafer 38 into device chips each including the device 44.

After the dividing step is conducted, a second conveying step is carried out in which the frame unit 34 is conveyed from the holding mechanism 2 to the cleaning unit 62 by the second conveying mechanism 64. In the second conveying step, the holding mechanism 2 is first moved to the mounting and detaching position. At the same time, the permanent magnets 96 of the second conveying mechanism 64 are positioned above the annular frame 36, and the suction piece 98 is positioned above the wafer 38. Subsequently, the frame unit holding section 92 is lowered. Accordingly, lower surfaces of the permanent magnets 96 are brought into contact with the upper surface of the annular frame 36 to hold the annular frame 36 by the magnetic force of the permanent magnets 96, and the lower surface of the suction piece 98 is brought into contact with the front surface 38a of the wafer 38 to hold the wafer 38 by the suction force of the suction piece 98.

Next, the suction force of the suction chuck 8 of the holding mechanism 2 is released, and the permanent magnets 12 of the holding mechanism 2 are positioned at the lowered positions. Then, the frame unit holding section 92 is raised. As described above, the magnetic force of the permanent magnets 96 of the second conveying mechanism 64 is weaker than the magnetic force of the permanent magnets 12 of the holding mechanism 2, and the permanent magnets 12 of the holding mechanism 2 are separated from the annular frame 36 when the permanent magnets 12 are positioned at the lowered positions. As a result, the magnetic force exerted on the annular frame 36 mounted on the tubular body 16, from the permanent magnets 96 of the second conveying mechanism 64 that are in contact with the annular frame 36 is stronger than the magnetic force exerted on the annular frame 36 from the permanent magnets 12 of the holding mechanism 2. Therefore, when the frame unit holding section 92 is raised, the frame unit 34 is held by the frame unit holding section 92 of the second conveying mechanism 64 and is spaced apart from the holding mechanism 2. Then, the Y-axis feeding mechanism 82 and the lifting mechanism 90 of the second conveying mechanism 64 are operated to convey the frame unit 34 to the cleaning unit 62.

After the second conveying step is conducted, a cleaning step is carried out in which cutting swarf generated in the dividing step is cleaned by the cleaning unit 62. Subsequently, a third conveying step is performed in which the frame unit 34 is conveyed from the cleaning unit 62 onto the tentative placing table 56 by the first conveying mechanism 60. Then, a conveying-in step is carried out in which the frame unit 34 is conveyed in from the tentative placing table 56 into the cassette 52 by the conveying-in/out mechanism 58.

Although not illustrated, similarly to the holding mechanism 2, the tentative placing table 56 and the cleaning unit 62 each include permanent magnets having a stronger magnetic force than that of the permanent magnets 76 and 96 of the first and second conveying mechanisms 60 and 64, and a release section that releases the annular frame 36 magnetically attached to the permanent magnets. In the second conveying step, the annular frame 36 of the frame unit 34 conveyed by the second conveying mechanism 64 is magnetically attached to the permanent magnets of the cleaning unit 62, so that the frame unit 34 is transferred from the second conveying mechanism 64 to the cleaning unit 62.

In the third conveying step, the annular frame 36 magnetically attached to the permanent magnets of the cleaning unit 62 is released from the permanent magnets by the release section of the cleaning unit 62, so that the frame unit 34 can be transferred from the cleaning unit 62 to the first conveying mechanism 60. In addition, the annular frame 36 of the frame unit 34 conveyed from the cleaning unit 62 by the first conveying mechanism 60 is magnetically attached to the permanent magnets of the tentative placing table 56, so that the frame unit 34 is transferred from the first conveying mechanism 60 onto the tentative placing table 56.

Note that, in the conveying-out step and the first conveying step, the permanent magnets of the tentative placing table 56 are retracted by the release section from the positions where the permanent magnets can magnetically attract the annular frame 36. As a result, when the frame unit 34 is conveyed out from the cassette 52 to the tentative placing table 56 by the conveying-in/out mechanism 58 and when the frame unit 34 is conveyed from the tentative placing table 56 to the holding mechanism 2 by the first conveying mechanism 60, the permanent magnets of the tentative placing table 56 do not magnetically attract the annular frame 36, and thus, the permanent magnets do not hinder the conveying-out and conveying of the frame unit 34.

As described above, in the holding mechanism 2 of the present embodiment, since the annular frame 36 is held by the magnetic force of the permanent magnets 12, the annular frame 36 can securely be held even if the positioning of the annular frame 36 relative to the holding mechanism 2 is not made sufficiently accurately.

Note that, in the first conveying mechanism 60, the suction piece 78 may not be provided, and the frame unit 34 may be held when the permanent magnets 76 magnetically attract the annular frame 36. In addition, in the second conveying mechanism 64, similarly to the first conveying mechanism 60, the suction piece 98 may not be provided, and the frame unit 34 may be held when the permanent magnets 96 magnetically attract the annular frame 36.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A holding mechanism that holds a frame unit formed by positioning a wafer at an opening of an annular frame and attaching the wafer and the annular frame to an adhesive tape to integrate the annular frame with the wafer, the annular frame including a ferromagnetic material with the opening for accommodating the wafer, the holding mechanism comprising:
   a wafer holding section that holds the wafer under suction; and
   a frame support section that is disposed on an outer circumference of the wafer holding section and that supports the annular frame,
   wherein the frame support section includes at least one tubular body, each of the at least one tubular body including a permanent magnet which moves within the tubular body, and which magnetically connects with the annular frame.

2. The holding mechanism according to claim 1,
   wherein the at least one tubular body includes a nonmagnetic material and an advancing-retracting section that moves the permanent magnet relative to the annular frame; and
   wherein when the permanent magnet is moved within the at least on tubular body, the annular frame is released from the magnetic connection with the permanent magnet.

3. The holding mechanism according to claim 2,
   wherein the advancing-retracting section further comprises:
   a rod which extends downward from a lower end of the permanent magnet;

a piston fixed to a lower end of the rod; and
a coil spring disposed under the piston.

4. The holding mechanism according to claim 2, wherein the at least one tubular body includes a lower-side accommodating chamber which accommodates the advancing-retracting section, wherein the advancing-retracting section further comprises a compressed air supply source connected to the lower-side accommodating chamber.

5. The holding mechanism according to claim 2, wherein an upper surface of the permanent magnet and an upper surface of the at least one tubular body are flush with each other when the annular frame is being held by the permanent magnet.

6. The holding mechanism according to claim 1, wherein the at least one tubular body includes an upper-side accommodating chamber which comprises:
   a projecting section, such that when an upward force is exerted on the permanent magnet, an upper end of a flange section of the permanent magnet is caught on a lower end of the projecting section so that the permanent magnet is positioned at a raised position, and
   a partition wall, such that when a downward force is exerted on the permanent magnet, a lower surface of the permanent magnet makes contact with an upper surface of the partition wall, so that the permanent magnet is positioned at a lowered position.

7. A holding mechanism that holds a frame unit formed by positioning a wafer at an opening of an annular frame and attaching the wafer and the annular frame to an adhesive tape to integrate the annular frame with the wafer, the annular frame including a ferromagnetic material with the opening for accommodating the wafer, the holding mechanism comprising:
   a wafer holding section that holds the wafer under suction;
   a frame support section that is disposed on an outer circumference of the wafer holding section and that supports the annular frame; and
   at least one tubular body that accommodates a permanent magnet which moves within the tubular body relative to the annular frame, wherein when the permanent magnet is moved within the tubular body, the annular frame is released from the magnetic connection with the permanent magnet.

8. The holding mechanism according to claim 7, wherein the at least one tubular body includes an advancing-retracting section comprising:
   a rod which extends downward from a lower end of the permanent magnet;
   a piston fixed to a lower end of the rod; and
   a coil spring disposed under the piston.

9. The holding mechanism according to claim 7, wherein the at least one tubular body includes a lower-side accommodating chamber which accommodates an advancing-retracting section of the at least one tubular body, wherein the advancing-retracting section further comprises a compressed air supply source connected to the lower-side accommodating chamber.

10. The holding mechanism according to claim 7, wherein an upper surface of the permanent magnet and an upper surface of the at least one tubular body are flush with each other when the annular frame is being held by the permanent magnet.

11. The holding mechanism according to claim 7, wherein the at least one tubular body includes an upper-side accommodating chamber which comprises:
   a projecting section, such that when an upward force is exerted on the permanent magnet, an upper end of a flange section of the permanent magnet is caught on a lower end of the projecting section so that the permanent magnet is positioned at a raised position, and
   a partition wall, such that when a downward force is exerted on the permanent magnet, a lower surface of the permanent magnet makes contact with an upper surface of the partition wall, so that the permanent magnet is positioned at a lowered position.

* * * * *